United States Patent
Kang et al.

(10) Patent No.: US 6,514,563 B1
(45) Date of Patent: Feb. 4, 2003

(54) METHOD OF ON-LINE COATING FILM ON THE INNER WALLS OF THE REACTION TUBES IN A HYDROCARBON PYROLYSIS REACTOR

(75) Inventors: Sin Cheol Kang, Seoul (KR); Ahn Seop Choi, Ulsan (KR); Dong Hyun Cho, Ulsan (KR); Sun Choi, Ulsan (KR)

(73) Assignee: SK Corporation, Seoul (KR)

( * ) Notice: Subject to any disclaimer, the term of this patent is extended or adjusted under 35 U.S.C. 154(b) by 0 days.

(21) Appl. No.: 09/671,404

(22) Filed: Sep. 27, 2000

(30) Foreign Application Priority Data

Jan. 28, 2000 (KR) .......................................... 2000-4328

(51) Int. Cl.[7] .............................. B05D 7/22; C23C 16/22
(52) U.S. Cl. ....................... 427/226; 427/237; 427/238; 427/239; 427/255.23; 427/255.395; 427/255.7; 427/419.2; 427/419.3
(58) Field of Search ............................ 427/237, 255.7, 427/255.395, 255.23, 419.2, 419.3, 419.1, 238, 239, 226

(56) References Cited

U.S. PATENT DOCUMENTS

| | | | | |
|---|---|---|---|---|
| 4,099,990 A | * | 7/1978 | Brown et al. ................ | 148/276 |
| 4,507,196 A | * | 3/1985 | Reed et al. .................. | 208/106 |
| 4,545,893 A | * | 10/1985 | Porter et al. ............. | 208/48 AA |
| 4,692,234 A | * | 9/1987 | Porter et al. ............... | 106/1.12 |
| 4,889,614 A | * | 12/1989 | Forester ................. | 208/48 AA |
| 5,015,358 A | * | 5/1991 | Reed et al. ............. | 208/48 AA |
| 5,284,994 A | * | 2/1994 | Brown et al. ............... | 208/106 |
| 5,567,305 A | * | 10/1996 | Jo ......................... | 208/48 AA |
| 6,093,260 A | * | 7/2000 | Petrone et al. .............. | 148/277 |
| 6,228,253 B1 | * | 5/2001 | Gandman .................... | 196/122 |
| 6,258,256 B1 | * | 7/2001 | Heyse et al. ................ | 208/106 |
| 6,322,879 B1 | * | 11/2001 | Stewart et al. ........... | 427/372.2 |

* cited by examiner

Primary Examiner—Shrive P. Beck
Assistant Examiner—Kirsten Crockford Jolley
(74) Attorney, Agent, or Firm—Welsh & Katz, Ltd.

(57) ABSTRACT

A method of on-line coating a coat film on the inner wall of a reaction tube in a hydrocarbon pyrolysis reactor for preventing the formation and the deposit of coke on the inner walls. This method comprises the steps of vapor depositing a mixed solution of a metal alkoxide and a chromic compound on the inner walls concurrently with introducing a carrier at a flow rate of 1–5000 kg/hr/coil at a temperature of 600–900° C. under a pressure of 0–3 kg/cm$^2$ to form a buffer layer on the inner walls; and vapor depositing a metal alkoxide as a barrier on the buffer layer; and vapor depositing an alkali metal/alkaline earth metal compound alone or mixed with metal alkoxide as a decoking layer on the barrier. A decoking layer may further be provided on the diffusion barrier.

12 Claims, 2 Drawing Sheets

Figure 1:
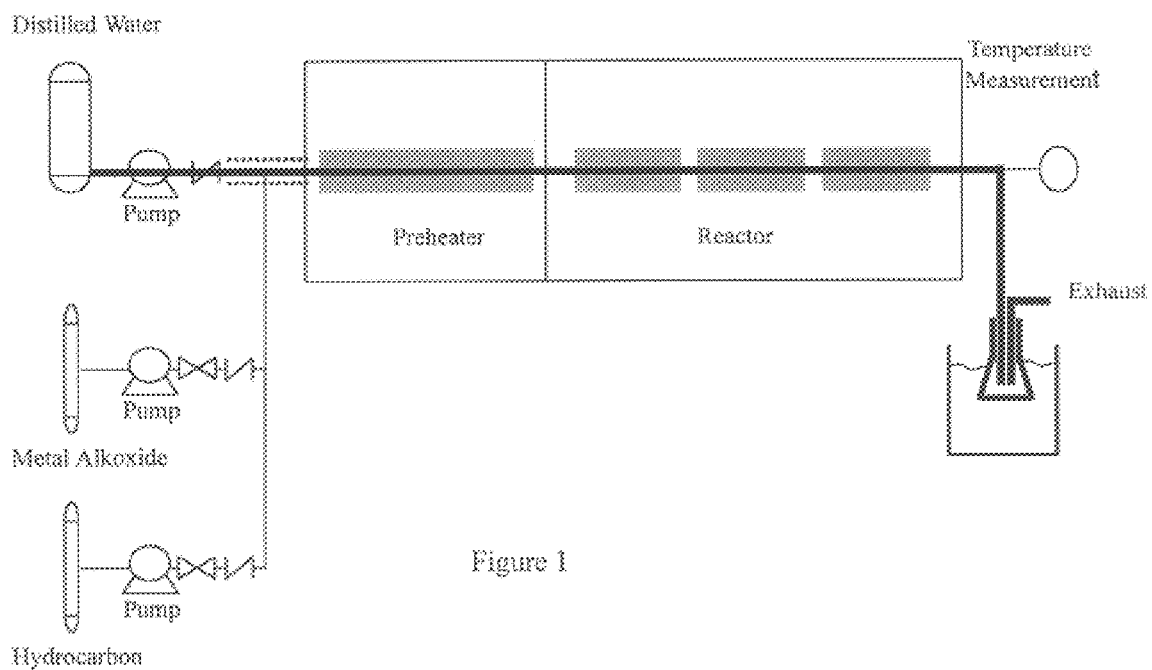

METHOD OF ON-LINE COATING FILM ON THE INNER WALLS OF THE REACTION TUBES IN A HYDROCARBON PYROLYSIS REACTOR

BACKGROUND OF THE INVENTION

1. Field of the Invention

The present invention relates to a method of on-line coating a coat film on the inner walls of the reaction tubes in a hydrocarbon pyrolysis reactor so that the formation and the deposit of coke on the inner walls can be prevented and inhibited. More particularly, the invention relates to a method of on-line coating an inorganic coat film on the inner walls of the reaction tubes to prevent the formation and the deposit of coke on the inner walls, to remove residual coke continuously, and to inhibit the carburization and deterioration of metals on the inner walls so that the operational duration of the reactor can be extended.

Reactors for use in the pyrolysis of hydrocarbons are commonly composed of a heating furnace and a series of tubular reactors, and are used in producing olefins such as ethylene, propylene and the like, by supplying steam and a hydrocarbon feedstock into the tubular reactors concurrently at an elevated temperature of above 800° C. in gaseous phase to induce the hydrocarbon feedstock pyrolysed. During the pyrolysis reaction, coke is formed as a by-product from the dehydrogenation of hydrocarbon by way of the catalytic and/or pyrolytic reaction. Catalytic coke is formed from catalytic reaction between a hydrocarbon and metals such as nickel and iron, which are present on the surface of the tubular reactor. Dehydrogenation of light olefins such as acetylene produces gaseous cokes, and dehydrogenation of heavy aromatic materials yield condensed coke.

These gaseous and condensed cokes are collectively referred to as a pyrolytic coke. As the pyrolysis reaction runs, the coke aggregates and accumulates on the inner walls of the reactor, alone or through a cooperative trap action.

Such aggregation or accumulation of the coke on the inner wall of the reactor tubes interferes with the flow of fluids in the pyrolysis reactor, causing an increase in the pressure drop between the frontal and the postal zones of the reactor, and deteriorates the efficiency of the heat transfer through the inner walls. This results in the reduction of the yields of the main product and the increase of the energy consumption. Carburization may also occur into the metals of which the reaction tubes are fabricated, reducing the durability of the reactor tubes.

2. Disclosure of the Prior Art

Therefore, when the coke is accumulated on the inner walls of the reaction tubes to a certain level, the operation of the reactor must be shut down to eliminate the coke accumulated. The amount of the production loss and the energy consumed to eliminate the accumulated coke are considerably high. Thus, many approaches have been proposed to prevent and inhibit the formation and deposit of the catalytic coke on the inner walls of a hydrocarbon pyrolysis reactor and to extend the cycle of operating the reactor.

Such approaches include: a method of using a specific alloy as a reactor tube material; a method of continuously injecting a certain chemical such as sulfur, an alkaline metal salt, an alkaline earth metal salt, phosphor, boron, cerium, lanthanum, molybdenum, or the like into a hydrocarbon feedstock; a method of pre-treating the inner surfaces of the reaction tubes with tin and silicone, aluminum, and phosphor; a method of allying a ceramic film onto the inner walls of a tubular reactor by molten-coating the inner walls with an alkaline earth metal compound; a method of physical vapor deposition of a mixture of a metal and ceramics on the inner walls of the reaction tubes; a method of chemical vapor deposition of silicone ceramics on the inner walls of the reaction tubes; and so forth.

U.S. Pat. Nos. 4,889,614 and 5,358,626 disclose a process for the gasification of coke into carbon monoxide or carbon dioxide by continuously injecting an alkaline metal or alkaline earth metal salt as a catalyst into a pyrolysis reactor during the pyrolysis of the hydrocarbon. However, this process has a drawback in that a considerable amount of the catalyst may be entrained into and accumulated on the recovery section.

WO 97/41275 discloses a method of forming a protective oxide film by coating a mixture of chromium, aluminum and silicon on fresh reaction tubes in a thickness of about 300 $\mu$m by way of a physical vapor deposition and then oxidizing the resultant coat film. This method, however, requires a separate step of coating a mixture of metals on the fresh tubes by an off-line method. Once the film has been worn down, it is impossible to re-coat the tubes without replacing the used tubes with new ones.

U.S. Pat. No. 4,099,990 discloses a method of vapor depositing a silica film having a thickness of about 2 $\mu$m onto a metallic reaction tube using tetraethoxysilane as a vapor deposition material and steam or carbon dioxide as a carrier. A test for the pyrolysis of ethane in the resultant tubes demonstrated that the amount of the coke accumulated could be reduced by about 80% at a temperature of 850° C. or less as compared with the uncoated tubes, while at a temperature of above 850° C., no improvement was obtained. In connection with this method, however, it is necessary to consider the appropriate coating thickness and the vapor deposition conditions for performing the function of the silica film as a barrier and to provide a measure by which the mechanical/thermal strength of the film can be secured. If the silica film is too thin, it does not perform its function as a barrier completely and may be easily worn out by carburization or oxidation during decoking. On the other hand, if the film is too thick, it is apt to peel off or rupture due to the difference in thermal expansion between the matrix metal and the silica film. Further, this patent neither suggests nor teaches clearly how to remove the accumulated coke, even though it is possible to reduce the accumulation of the coke to some extent by covering the tube surfaces with an inactive inorganic oxide film to inhibit the catalytic reaction of the metallic components by which the formation of coke is accelerated.

DETAILED DESCRIPTION OF THE INVENTION

According to the present invention, it has been discovered that by coating the inner walls of the reaction tubes in a hydrocarbon pyrolysis with an inorganic film to prevent a catalytic reaction between a hydrocarbon feedstock and a metal such as nickel and iron, it is possible to lower the formation and the deposit of coke on the inner wall and inhibit the carburization and deterioration phenomena of the metals due to the coke.

Accordingly, the object of the invention is to provide a method of on-line coating the inner walls of the reaction tubes in a hydrocarbon pyrolysis reactor to prevent the formation and the deposit of coke on the inner walls.

The above object of the invention can be achieved by an on-line method of providing a coat film on the inner wall of a reaction tube in a hydrocarbon pyrolysis reactor, which comprises the steps of vapor depositing a mixed solution of a metal alkoxide and a chromic compound on the inner wall concurrently with introducing a carrier at a flow rate of 1–5000 kg/hr/coil at a temperature of 600–900° C. under a pressure of 0–3 kg/cm$^2$ to form a buffer layer on the inner walls; and vapor depositing a metal alkoxide as a diffusion barrier on the buffer layer; and then optionally vapor depositing an alkali metal/alkaline earth metal compound alone or mixed with metal alkoxide as decoking layer to obtain a continuously formed coat film.

In this connection, it is noteworthy to understand that the diffusion barrier can be vapor deposited directly on the inner walls under the same conditions as mentioned above, without providing the buffer layer, and that a decoking layer can then optionally be vapor deposited on the diffusion barrier and/or the buffer layer.

Figure 2:
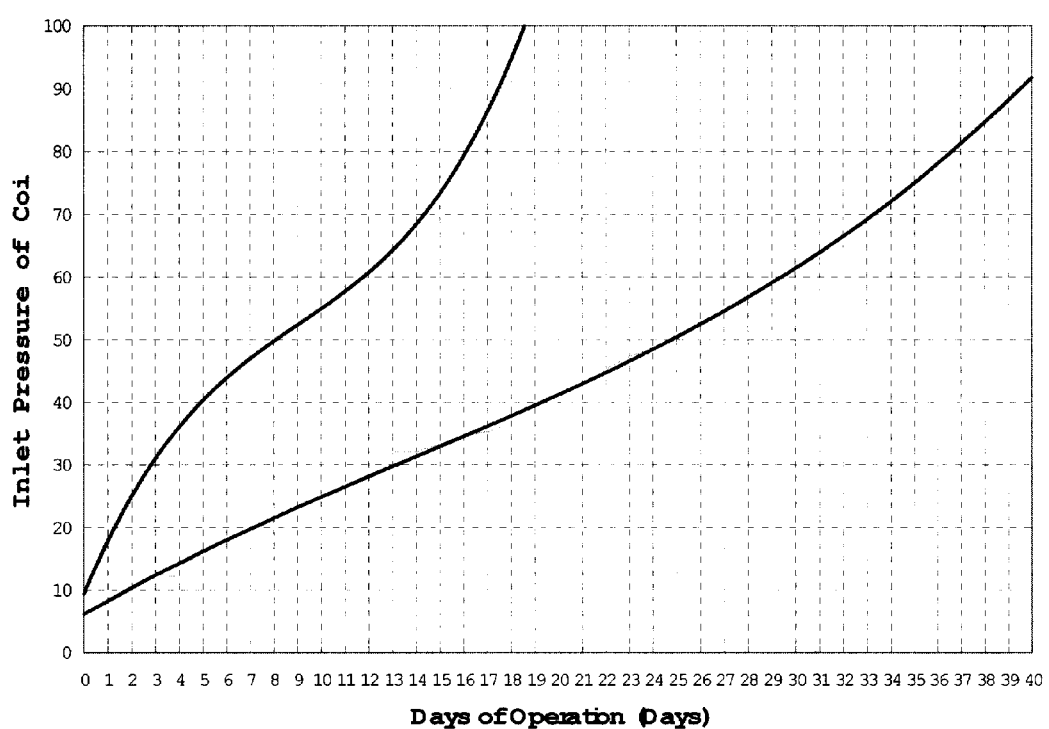

The above and other objects as well as advantages of the invention will be more apparently recognized with reference to the description hereinafter and the accompanying drawings wherein:

FIG. 1 illustrates a schematic diagram of an apparatus for coating a buffer layer, and/or a diffusion barrier, and/or a decoking layer on the inner walls of a reaction tube, and performing a test for the pyrolysis reaction of a hydrocarbon using the tube so coated, according to the invention; and FIG. 2 is graph showing a change in the pressure drop at the inlet of the reactor used in Example 4 of the invention, compared with the pressure drop at the inlet of a conventional hydrocarbon pyrolysis reactor.

The present invention relates to a method of on-line coating a coat film for preventing the formation and the deposit of coke on the inner walls of the reaction tubes in a hydrocarbon pyrolysis reactor and preventing the carburization or deterioration of metals on the inner walls. According to the invention, it is essential to provide, in a batch process, an appropriate layer that can serve as a diffusion barrier on the inner walls of the reaction tubes in a hydrocarbon pyrolysis reactor; and a buffer layer which can obtain a solid coat film having good chemical/thermal strength so that better durability can be achieved; and a decoking layer which can minimize the amount of the gaseous coke deposited and condensed on the inner walls, which are not suppressed easily by the barrier. In order to make the coat film formed according to the invention commercially useful, it is important that the film should have sufficient mechanical and thermal strength to resist against the operating conditions. It is also important that it is able to eliminate any adverse effects which may occur in the postal steps of the reaction process, and that it can be re-coated on the inner walls when necessary.

As well known in the art, the term "on-line coating" used herein means that the method of the invention can be performed during the operation of the hydrocarbon-pyrolysis process without cooling down the process and removing the reaction tubes.

The inventors have discovered a thickness of the barrier suitable for performing the invention by subjecting it to a pyrolysis test. The problems associated with the peeling off or rupture of the diffusion barrier (inorganic coat film) due to the difference in the coefficient of thermal expansion between the metal and the barrier have also been eliminated by forming a buffer layer using a mixture of the buffer components.

The residual cokes not suppressed by the barrier may also be removed by optionally forming a decoking layer. Also, the problems of adverse effects on the recovery section have been addressed by sending the furnace effluents to a decoking drum.

Further, according to the invention, the reaction tubes can directly be coated while being hot and, therefore, it is possible to re-coat the tubes in a hot state during the operation of the reactor.

Particularly, in performing the invention, after the coke is combusted in a hydrocarbon pyrolysis reactor equipped with a series of tubular reaction tubes, by way of a carrier of 1–5000 kg/hr/coil at 600–900° C. under 0–3 kg/cm$^2$, a metal alkoxide is carried into the tubes in an amount of 0.001–10%, preferably 0.05–1.0% based on the weight of the carrier introduced. Then, the alkoxide absorbs the heat for a residence time of 0.5–2 seconds, and is then decomposed and deposited on the inner walls of the tubes to form a diffusion barrier. Where the amount of the alkoxide introduced is below 0.001% by weight, it requires a long period of time to be coated to a desired thickness. Where the amount exceeds 10% by weight, the resultant particles may deteriorate the physical properties of the coat film so formed. The thickness of the coat film is preferably in the range of 4–12 $\mu$m. If the thickness is below 4 $\mu$m, the film does not serve as a barrier. If the thickness exceeds 12 $\mu$m, the film tends to peel off or rupture as the temperature varies.

Upon completion of the deposition of the coat film, the temperature is gradually elevated until it reaches the temperature of hydrocarbon pyrolysis by 200° C. or less per hour. In this process, the organic groups remaining in the coat film are removed to form a solid inorganic coat film. Non-limiting metal alkoxides suitable for a deposition material include volatile silicone alkoxides such as tetraethoxysilane and tetramethoxysilane; titanium alkoxides such as titanium tert-butoxide, titanium ethoxide, and titanium isopropoxide; and aluminum alkoxides such as aluminum acetylacetonate and aluminum isopropoxide. These are used alone or in combinations thereof. Non-limiting carriers include nitrogen, helium, argon, carbon dioxide, air, oxygen, and steam. Among them, steam is more preferred in the pyrolysis in view of saving production costs.

The alkoxide may be introduced into the reactor tube, for example, by diluting it in the carrier. The dilution is carried out by bubbling the carrier through the alkoxide or by pumping the alkoxide directly into the carrier. Practically, the latter method is more preferred.

However, the inorganic coat film formed of such a metal alkoxide is apt to easily peel off or rupture from thermal shock because its thermal expansion coefficient is just about 1/20 as compared with that of the metallic tubular reactor. Therefore, it is desirable to have a medium layer, namely, a metal oxide buffer layer sandwiched between the inner wall of the metallic reactor tube and the inorganic coat film to reinforce the mechanical/thermal strength of the entire coat film. The oxide buffer layer can be provided by depositing a mixed solution of a metal alkoxide and a chromium compound on the inner walls of the reaction tubes. The chromium compounds include chromium acetyl acetonate, chromium carbonyl, chromic (III) 2-ethylhexanoate, and chromic (III) hexafluoroacetyl acetonate. Preferably, chromium acetyl acetonate [Cr(C$_5$H$_7$O$_2$)$_3$, FW 349.33] is used, which has a boiling point of about 340° C. and is sufficiently volatile.

The above chromium compounds are present in solid form at room temperature and thus are needed to dissolve them in an adequate organic solvent such as tetrahydrofuran, toluene, and so forth. The toluene may act as a precursor producing coke during pyrolysis at a high temperature. Therefore, the use of toluene is avoided when possible and tetrahydrofuran is preferably used in the invention. Concurrently with introducing the carrier into the reactor tubes, a metal alkoxide and a chromium compound are injected in an amount of 0.001–10% by weight and in an amount 0.001–1.0% by weight, respectively, based on the total weight of the carrier, resulting in a buffer layer having a 1–5 μm thickness directly on the inner walls of the reactor tubes. Preferably, the metal alkoxide and the chromium compound are introduced in a mixture in an amount of 0.005–1.0% by weight based on the total weight of the carrier. When the metal alkoxide is used in an amount of less than 0.001% by weight, it is insufficiently transferred to the outlet of the reactor, or requires much time to obtain a suitable thickness of the barrier film. When the alkoxide is used in an amount of above 10% by weight, it will be wasteful due to its low deposition yield and the physical properties of the resultant coat film will be degenerated due to the formation of particles. If the amount of the chromium compound used is less than 0.001% by weight, there will be little or no effect. If it is used in an amount of above 1.0% by weight, it will also be wasteful. Further, if the thickness of the buffer layer is less than 1 μm, satisfactory buffering effects cannot be obtained, and if above 5 μm, further improvement cannot be expected.

Meanwhile, the provision of a diffusion barrier on the surfaces on the reactor tubes can inhibit a catalytic reaction of the metal components that may cause the coke formation. However, the gaseous or condensed coke cannot be prevented from being deposited on the barrier. In addition to the diffusion barrier, a mixture of an alkoxide and an alkaline metal compound or an alkaline earth metal compound may optionally be deposited on the barrier to form a decoking layer thereon. This decoking layer can give coke gasification ability to the barrier.

In providing an alkaline metal or alkaline earth metal compound film on the reactor tubes as a decoking layer in accordance with the on-line coating method of the invention, it is important to select adequate precursors depending upon the operating conditions such as the vapor deposition temperature and the types of the carriers. Those precursors include organic compound such as alkoxides, beta diketonates, alkylates, carboxylates, and inorganic compounds such as nitrates and carbonates. Examples of the alkaline metal/alkaline earth metal compounds include potassium acetyl acetonate, potassium tetramethyl heptanedionate, potassium acetate, calcium acetyl acetonate, calcium tetramethyl heptanedionate, calcium acetate, magnesium acetyl acetonate, magnesium tetramethyl heptanedionate, magnesium acetate, barium acetyl acetonate, barium tetramethyl heptanedionate, barium acetate, lithium acetyl acetonate, lithium tetramethyl heptanedionate and lithium acetate. These compounds may be used alone or in combinations thereof.

The amount of alkaline metal/alkaline earth metal compounds used is 0.001–10% by weight, preferably 0.05–1.0% by weight with respect to the total amount of the carrier introduced. Beyond this range, the deposition time may be increased, resulting in lowering the deposition yields and degenerating the physical properties of the desired coat film. The thickness of the coat film deposited is preferably 0.1–2 μm. If the thickness is not within this range, a sufficient coke gasification effect cannot be obtained, or an undesirable coat film is apt to be formed.

As described above, the method according to the invention can be performed at a high temperature, and thus a pure inorganic oxide film can be deposited on the inner walls of the reaction tubes by minimizing thermal shock. Further, in the invention, there are no limitations in the surface conditions and the term of use of the reaction tubes to be coated. Therefore, whenever the coat film has been worn out, it is possible to re-coat the film on the inner walls of the tubes during the operation of the reactor without replacing the tubes with new ones.

In addition, sufficient mechanical/thermal strength can be obtained by introducing a buffer layer between the tube metal and the barrier to provide a coat film having an appropriate thickness. Also, residual coke can be removed by impregnating a catalyst for gasifying coke on the diffusion barrier without adverse effects on the recovery section.

According to the invention, it has been confirmed that in order to assure the function of the coat film for inhibiting the carburization of the metal components in the inner walls of the reaction tubes, the thickness of the coat film must be about 4 μm. In performing the method of the invention, the increasing rate of the pressure at the inlet of the reactor is reduced to below ½; thus, the operating term of the reactor can be considerably extended.

The present invention will be described in greater detail by means of the following non-limiting examples.

EXAMPLE 1

In this example, an experimental test for applying a buffer layer between the inner walls of a metallic tube used in a hydrocarbon pyrolysis reactor and a diffusion barrier, namely a silica film coat formed thereon, to compensate for the thermal expansion difference and increase the mechanical/thermal strength between the metallic tube and the barrier was performed. A mixture of chromium oxide and silica was used as a buffer layer. As material for the vapor depositions of the chromium oxide and the silica, chromium acetyl acetonate and tetraethoxy silane were each used. For the purpose, 1.2 g of chromium acetyl acetonate was dissolved in 36 ml of tetrahydrofuran.

As shown in FIG. 1, a tubular tube (0.68 cm in inner diameter and 69 cm in length) made of a high nickel alloy was installed within the heating furnace. The tube was adjusted at an inlet temperature of 620° C. and at an outlet temperature of 750° C. Then, steam preheated at 450° C. was passed through the tube at a flow rate of 100 g/h for 8 hours, together with 0.5% of tetraethoxysilane and 0.01% of chromium acetyl acetonate, based on the total weight of the steam, to coat the inner wall of the tube. Observation under a scanning electron microscope of the resultant coat film showed that a resultant buffer layer of a metal oxide having a thickness of about 3–4 μm was formed.

After the buffer layer was formed, tetraethoxysilane was continued to be injected into the tube in an amount of 0.6% by weight for 10 hours, to evaluate the resultant coat film. After the coating operation was completed, the resultant coat film was examined under a scanning electron microscope with respect to its morphology and thickness. The diffusion layer was confirmed to be a solid film having a thickness of 7–11 μm.

To test the thermal strength of the coat film, a test piece was maintained for 60 hours at 1000° C. and then slowly cooled. Observation under a scanning electron microscope confirmed no loss occurred in the film.

EXAMPLE 2

In this example, another test was carried out to evaluate the ability of preventing and reducing the formation and deposit of coke on the inner walls of a reaction tube in a hydrocarbon pyrolysis reactor. A sample reaction tube which is made of HK4M (Cr: 25% and Ni: 25%) was installed in the reactor as shown in FIG. 1, and the inner wall of the tube was then coated according to the same procedures described as in Example 1. Ethane was subject to pyrolysis in the reactor under the reaction conditions given in a table below. After the pyrolysis reaction, a scanning electron microscope examination showed that the formation of coke on the inner walls was dramatically reduced as compared with the uncoated tube.

TABLE

| Feedstock | Ethane |
|---|---|
| Inlet Temperature (° C.) | 600 |
| Outlet Temperature (° C.) | 845 |
| Reactor Pressure | Atmosphere |
| Weight Ratio of Steam/Ethane | 0.3 |
| Conversion of Ethane (%) | 80 |
| Operation Period (hours) | 2 |

EXAMPLE 3

In this example, a solution of an inorganic alkaline metal compound, calcium acetyl acetonate was further injected onto the silica diffusion barrier for 7 hours in an amount of 0.067% by weight with respect to the amount of the steam concurrently injected, to form a decoking layer on the diffusion barrier. The formation of coke was continuously eliminated during operation. The solution was prepared by dissolving 1 g of calcium acetyl acetonate in a mixture of 50 g of methanol and 0.5 g of 60% nitric acid. An X-ray analysis of energy scattering type detected 9.0% by weight of calcium. To compare the efficiency of removing the coke by the decoking formed on the barrier with that by a combination of the buffer layer and the diffusion barrier, the same test as described in Example 2 was performed, and it was then observed under an scanning electron microscope. As a result, no coke formation was observed.

EXAMPLE 4

The results obtained from the tests done above were applied to a commercial pyrolysis reactor (KBR Millisecond pyrolysis reactor). Immediately after the combustion process of coke was completed, the inlet and the outlet of the reactor were adjusted at 620° C. and 730° C., respectively. Then, 74 kg/h per tube of the steam preheated to 620° C. was injected into the reaction tubes in the reactor, together with 0.002% by weight of chromium acetyl acetonate and 0.2% by weight of tetraethoxysilane, for 8 hours, to have the inner walls of the reaction tubes coated.

Upon completion of the coating operation, a feedstock, naphtha was charged into the reactor after the temperature was elevated to a temperature for carrying out the pyrolysis of the naphtha by 60° C. per hour. The level of the coke formed was observed by monitoring the pressure change at the inlet of the reactor. The pressure changes before and after coating the inner walls of the reactor tubes are plotted in FIG. 2. As can be seen from FIG. 2, the increasing rate of the pressure after coating is about half of that before the coating.

As described above, according to the invention, it is possible to prevent the production of coke during the pyrolysis reaction of hydrocarbons in a pyrolysis reactor and remove the coke through the gasification thereof. This allows the cycle run length of the reactor to be extended. Accordingly, it is also possible to save the costs of combustion of the coke and to increase the production capacity of the target products. Further, according to the invention, carburization and deterioration of metals on the reactor tubes by the barrier function of the diffusion barrier can also be inhibited. This extends the life of the reactor tubes. The invention has another advantage in that a coat film having an improved mechanical/thermal strength can be obtained without causing any adverse effects during the postal step of the process involved, and that the coat film can be intermittently coated on the inner wall of a reaction tube in an on-line method whenever desired during the process, even if the initial coat film was not permanently made.

It will be apparently understood, of course, that various changes and modifications can be made in the embodiments of the invention illustrated and described herein without departing from the spirit and the scope of the invention as defined by the appended claims.

What is claimed is:

1. A method of on-line coating a continuous coat film on an inner wall of the reaction tube in a hydrocarbon pyrolysis reactor for preventing the formation and deposit of cokes on the inner wall, comprising the steps of:

vapor depositing a mixed solution of a metal alkoxide and a chromium compound on the inner wall, concurrently with introducing a carrier into the reaction tubes at a flow rate of 1–5000 kg/hr/coil at a temperature of 600–900° C. under a pressure of 0–3 kg/cm$^2$ to form a buffer layer on the inner walls; and then vapor depositing a metal alkoxide as a diffusion barrier on the buffer layer, concurrently with introducing a carrier into the reaction tubes at a flow rate of 1–5000 kg/hr/coil at a temperature of 600–900° C. under a pressure of 0–3 kg/cm$^2$, and then forming a decoking layer on the diffusion barrier by vapor depositing a mixture of an alkoxide and an alkaline metal compound or alkaline earth metal compound, concurrently with introducing a carrier into the reaction tubes at a flow rate of 1–5000 kg/hr/coil at a temperature of 600–900° C. under a pressure of 0–3 kg/cm2.

2. The method of claim 1, wherein the carrier used to form the buffer layer, diffusion barrier, or decoking layer is one selected from the group consisting of nitrogen, helium, argon, carbon dioxide, air, oxygen, and steam.

3. The method of claim 1, wherein the diffusion barrier is deposited by introducing the metal alkoxide in an amount of 0.001–10% by weight based on the total amount of the carrier into the reactor.

4. The method of claim 1, wherein the diffusion barrier is 4–12 $\mu$m in thickness.

5. The method of claim 1, wherein, in the buffer layer, the metal alkoxide and the chromium compound are each introduced into the reactions tubes in an amount of 0.001–10% by weight and in an amount of 0.001–10% by weight, respectively, based on the total weight of the carrier.

6. The method of claim 5, wherein, in the buffer layer, the metal alkoxide and the chromium compound are each introduced into the reaction tubes in an amount of 0.05–1.0% by weight, respectively, based on the total weight of the carrier.

7. The method of claim 1, wherein the buffer layer is 1–5 $\mu$m in thickness.

8. The method of claim 1, wherein the metal alkoxide used to form the buffer layer or diffusion barrier is one selected from the group consisting of tetraethoxysilane, tetramethoxysilane, titanium tert-butoxide, titanium isopropoxide, aluminum acetyl acetonate, and aluminum isopropoxide, and a combination thereof.

9. The method of claim 1, wherein the chromium compound is one selected from the group consisting of chromium acetyl acetonate, chromium carbonyl, chromic (III) 2-ethylhexanonate, and chromic (III) hexafluoroacetyl acetonate, and a combination thereof.

10. The method of claim 1, wherein the alkaline meal compound or alkaline earth metal compound is one selected from the group consisting of potassium acetyl acetonate, potassium tetramethyl heptanedionate, potassium acetate, calcium acetyl acetonate, calcium tetramethyl heptanedionate, calcium acetate, magnesium acetyl acetonate, magnesium tetramethyl heptanedionate, magnesium acetate, barium acetyl acetonante, barium tetramethyl heptanedionate, barium acetate, lithium acetyl acetonate, lithium tetramethyl heptanedionate, and lithium acetate, and a combination thereof.

11. The method of claim 1, wherein the alkaline metal or alkaline earth metal compound is introduced into the reactor in an amount of 0.001–10% by weight based on the total amount of the carrier.

12. The method of claim 1, wherein the decoking layer is 0.1–2 $\mu$m in thickness.

* * * * *